(12) United States Patent
Ng et al.

(10) Patent No.: US 8,823,184 B2
(45) Date of Patent: Sep. 2, 2014

(54) OPTOELECTRONIC DEVICE AND METHOD FOR THE PRODUCTION THEREOF

(75) Inventors: Kok Eng Ng, Penang (MY); Bin Abdul Manaf Shahrol-Izzani, Penang (MY)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/813,234

(22) PCT Filed: Aug. 1, 2011

(86) PCT No.: PCT/EP2011/063244
§ 371 (c)(1),
(2), (4) Date: Apr. 4, 2013

(87) PCT Pub. No.: WO2012/013822
PCT Pub. Date: Feb. 2, 2012

(65) Prior Publication Data
US 2014/0110865 A1    Apr. 24, 2014

(30) Foreign Application Priority Data

Jul. 30, 2010    (DE) .......................... 10 2010 032 834

(51) Int. Cl.
| | |
|---|---|
| H01L 23/48 | (2006.01) |
| H01L 23/00 | (2006.01) |
| H01L 27/146 | (2006.01) |
| H01L 51/52 | (2006.01) |
| H01L 25/16 | (2006.01) |
| H01L 31/0203 | (2014.01) |
| H01L 25/04 | (2014.01) |

(52) U.S. Cl.
CPC ................ *H01L 24/29* (2013.01); *H01L 24/83* (2013.01); *H01L 27/14618* (2013.01); *H01L 25/048* (2013.01); *H01L 51/5203* (2013.01); *H01L 25/167* (2013.01); *H01L 31/0203* (2013.01)

USPC .................. 257/783; 257/40; 257/88; 257/99

(58) Field of Classification Search
CPC ............ H01L 27/3225; H01L 27/3276; H01L 27/3288; H01L 24/26; H01L 24/83; H01L 25/167; H01L 25/048; H01L 51/5203; H01L 31/0203
USPC ........................................ 257/40, 88, 99, 783
See application file for complete search history.

(56) References Cited

U.S. PATENT DOCUMENTS

| 6,194,960 B1 | 2/2001 | Nagumo |
| 6,919,630 B2 | 7/2005 | Hsiao |

(Continued)

FOREIGN PATENT DOCUMENTS

| DE | 10 2006 059 168 A1 | 4/2008 |
| JP | 11-186493 A | 7/1999 |
| JP | 2000-307133 A | 11/2000 |

OTHER PUBLICATIONS

"*CP5720GT Anisoiropic Conductive Film*" Technical Report, Sony Chemicals Corp.; May 21, 2008, Ver. 1, pp. 1-11.

*Primary Examiner* — A. Sefer
(74) *Attorney, Agent, or Firm* — DLA Piper LLP (US)

(57) ABSTRACT

An optoelectronic component includes a first substrate on which are arranged an active region and a first contact region, and a first contact layer arranged in the first contact region. The second component includes a second substrate on which is arranged at least one second contact layer arranged in a second contact region. The first contact layer connects electrically conductively with the active region and additionally is bonded to the second contact layer by an adhesive layer. The adhesive layer includes an electrically conductive adhesive. The first contact layer and/or the second contact layer are patterned at least in part.

15 Claims, 5 Drawing Sheets

(56) References Cited

U.S. PATENT DOCUMENTS

| | | |
|---|---|---|
| 8,330,053 B2 | 12/2012 | Grespan |
| 2003/0117543 A1* | 6/2003 | Chang ............................ 349/58 |
| 2003/0168966 A1 | 9/2003 | Kobayashi et al. |
| 2006/0202333 A1 | 9/2006 | Sun et al. |
| 2006/0270304 A1* | 11/2006 | Aita ................................ 445/25 |
| 2008/0042549 A1* | 2/2008 | Song et al. .................... 313/498 |
| 2009/0133916 A1 | 5/2009 | Grespan |
| 2011/0193478 A1* | 8/2011 | Kim ................................ 315/32 |

* cited by examiner

OPTOELECTRONIC DEVICE AND METHOD FOR THE PRODUCTION THEREOF

RELATED APPLICATIONS

This is a §371 of International Application No. PCT/EP2011/063244, with an international filing date of Aug. 1, 2011 (WO 2012/013822 A1, published Feb. 2, 2012), which is based on German Patent Application No. 10 2010 032 834.0 filed Jul. 30, 2010, the subject matter of which is incorporated herein by reference.

TECHNICAL FIELD

This disclosure relates to optoelectronic device with an optoelectronic first component and a second component, with which the optoelectronic component is electrically contacted.

BACKGROUND

It has been established that optoelectronic components to which a second component for example, for controlling the optoelectronic component, has been applied by an electrically conductive adhesive layer, exhibit delamination phenomena after a certain time, resulting in no or only inadequate electrical contact between the two components.

It could therefore be helpful to provide an optoelectronic device which exhibits improved ageing stability, the ageing stability of the electrical contact between the optoelectronic component and a second component being of particular significance. It could also be helpful to provide a method of producing such an optoelectronic device.

SUMMARY

We provide optoelectronic device including an optoelectionic component with a first substrate on which are arranged an active region and a first contact region; at least one first contact layer arranged in the first contact region; and a second component with a second substrate on which is arranged at least one second contact layer arranged in a second contact region, wherein the first contact layer connects electrically conductively with the active region, the first contact layer and the second contact layer are bonded together electrically conductively via an adhesive layer including an electrically conductive adhesive, and the first contact layer and/or the second contact layer are at least partly patterned.

We also provide a method of producing an optoelectronic device including A) providing an optoelectronic component with an active region and at least one first contact layer arranged on a first substrate in a first contact region, the first contact layer being connected electrically conductively with the active region; B) providing a second component with a second substrate with at least one second contact layer arranged in a second contact region; D) applying an electrically conductive adhesive in the first contact region and/or in the second contact region; and E) arranging the second substrate over the first substrate such that the first contact layer connects electrically conductively with the second contact layer via the electrically conductive adhesive; wherein the first contact layer and/or the second contact layer are here applied in a step C1) in patterned manner before being provided or are patterned in a step C2) subsequent to step A) and/or step B).

We further provide an optoelectronic device including an optoelectronic component with a first substrate on which are arranged an active region and a first contact region, at least one first contact layer arranged in the first contact region, a second component with a second substrate on which is arranged at least one second contact layer arranged in a second contact region, wherein 1) the first contact layer connects electrically conductively with the active region 2) the first contact layer and the second contact layer are bonded together electrically conductively via an adhesive layer including an electrically conductive adhesive, 3) the first contact layer and/or the second contact layer are patterned at least in part, and 4) the first contact layer and/or the second contact layer includes sub-regions separated from one another at least in part by separating regions filled with the electrically conductive adhesive, the sub-regions being connected together electrically conductively.

DETAILED DESCRIPTION

Figure 1:
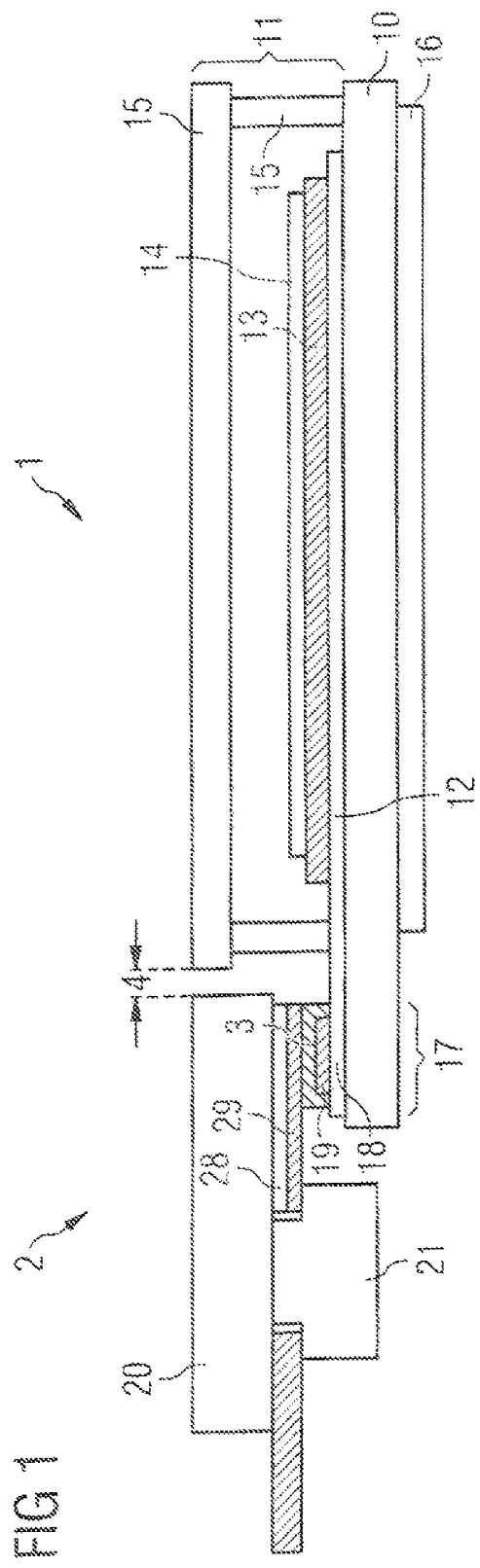
FIG. 1 is a schematic representation of an optoelectronic device.

Our optoelectronic device comprises an optoelectronic (first) component and a second component. The optoelectronic component comprises a first substrate on which are arranged an active region and a first contact region. At least one first contact layer is arranged in the first contact region. The second component comprises a second substrate on which a second contact layer is arranged in a second contact region. The first contact layer and the active region are bonded together electrically conductively just as are the first contact layer and the second contact layer. The bond between first contact layer and second contact layer proceeds by way of an adhesive layer which comprises an electrically conductive adhesive. In addition, the first contact layer or the second contact layer or both contact layers are patterned at least in part.

The first and/or second contact layer may be patterned in that they contain pattern elements such as, for instance, trenches which separate sub-regions of the contact layer from one another. However, patterning may also be provided on just the surface of the first contact layer or of the second contact layer facing the adhesive layer or on both surfaces facing the adhesive layer of the two contact layers. Patterning may in particular be configured such that a noninterlocking or interlocking connection is present between the contact layer and the adhesive layer. A noninterlocking connection is present if, under the action of tensile forces in the direction of the layer patterning prevents the adhesive layer and contact layer from being able to move relative to one another. Patterning of the contact layer or of the surface themselves is in particular understood to mean that the contact layer is either subjected to a patterning process after application thereof in which material is removed from the surface of the contact layer only in sub-regions resulting, for example, in trenches, or alternatively, patterning may also proceed such that actually during application of the contact layer, for example, using masks or printing processes in which only certain regions are selectively printed, a contact layer surface may be obtained in which at least the thickness of the contact layer varies in the various regions produced by the mask or the printing process. Patterning may often additionally proceed such that it is present not only at the edges of the contact region but rather in particular in the center of the contact region. The patterning may, for example, comprise trenches or channel-type structures (which may also be oriented parallel to one another). It may, however, also comprise any desired indentations of another geometry which penetrate wholly or partially through the contact layer.

We discovered that patterning of at least one of the two contact layers results in better adhesion of the adhesive layer and therefore delamination cannot arise so readily. Better adhesion may result from the fact that the adhesion threes between adhesive layer and contact layer surface are assisted by surface pattern elements such that the pattern elements produce a noninterlocking connection, for example, to cushion stresses applied by a force acting from a given direction (for example tensile or shear forces in the direction of the substrate planes of the first and the second substrates). Patterning may, however, also be attributed to interlocking connections between adhesive layer and contact layer surface (for instance as a result of any undercuts which are present).

The first and/or second contact layer may be patterned such that it comprises at least sub-regions separated from one another by separating regions. The separating regions are in particular filled with the electrically conductive adhesive. The contact layer may, for example, form a comb-like pattern, if the patterning or the separating regions take the form of trenches in the contact layer. These trenches may, for example, extend substantially parallel to one another. In addition, the trenches may be arranged such that they extend substantially vertically to the longer side (hereinafter also longitudinal side) of a, for example, rectangular contact layer.

Alternatively, the sub-regions of the contact layer may also be completely separated from one another. In this case, the sub-regions of the contact layer of the optoelectronic component or of the second component are generally additionally connected together electrically conductively. This may be achieved, for example, by a bonding layer arranged between substrate and contact layer sub-regions or indeed by corresponding conductor tracks arranged on the substrate of the optoelectronic component or second component. If the sub-regions of the patterned contact layer are separated completely from one another, the contact layer may be "fragmented" in particular in the longitudinal direction thereof such that the individual sub-regions are arranged one behind the other in the longitudinal direction on the substrate, wherein the separating regions filled with the electrically conductive adhesive during the production process connect together the chain of sub-regions formed in this way. If sub-regions of the contact layer separated are present, these sub-regions do not as a rule correspond to individual electrode segments which are suitable for controlling individual pixels in the active region. Instead, the sub-regions of the contact layer are as a rule precisely not intended to serve as constituents of an active or passive matrix display.

A bonding layer may be present between the first contact layer and the first substrate or the second contact layer and the second substrate or both between contact layer and substrate of the optoelectronic component and between contact layer and substrate of the second component. Like the contact layer, the bonding layer is then also formed of an electrically conductive material. As a rule, the material from which the contact layer and the bonding layer of a component are formed is different in this case.

Both the contact layer and the bonding layer of the optoelectronic and of the second component may comprise a metal or a transparent electrically conductive oxide. For example, the first and/or the second contact layer may comprise a metal or consist of a metal. The bonding layer may comprise or consist of a conductive oxide, in particular a transparent conductive oxide. In the case of completely separated contact layer sub-regions, a contact layer of metal formed by multiple sub-regions may thus, for example, be present on a bonding layer of a transparent conductive oxide in which contact layer the individual sub-regions are separated from one another or, from the point of view of the electrical connection, be connected together only via the bonding layer, providing no electrically conductive adhesive is arranged on the contact layer.

Transparent conductive oxides ("TCO" for short) are transparent, conductive materials, generally metal oxides such as, for example, zinc oxide, tin oxide, cadmium oxide, titanium oxide, indium oxide or indium tin oxide (ITO). In addition to binary metal-oxygen compounds such as, for example ZnO, $SnO_2$ or $In_2O_3$, ternary metal-oxygen compounds such as, for example $Zn_2SnO_4$, $CdSnO_3$, $ZnSnO_3$, $MgIn_2O_4$, $GaInO_3$, $Zn_2In_2O_5$ or $In_4Sn_3O_{12}$ or mixture of different transparent conductive oxides also belong to the TCO group. Furthermore, TCOs do not necessarily correspond to a stoichiometric composition and may be also p- or n-doped.

The metal of the bonding layer or contact layer may, for example, comprise or consist of chromium, copper or aluminum. Alternatively, the metal may be formed from alloys of these elements or alloys which contain these elements.

The bonding layer may merge into the substrate-side electrode of the active region of the optoelectronic component, in particular if the bonding layer is formed of a transparent conductive oxide or a very thin metal layer (for example, with a thickness of 10 to 30 nm). The substrate-side electrode and the bonding layer then thus form a continuous layer on which on the one hand the contact layer and on the other band the active layer is arranger. As a rule, an encapsulation is additionally arranged between the two layers on the mutually merging bonding layer/substrate-side electrode. It is likewise possible, in the case of the second component for the bonding layer to merge into a conductor track or an electrically conductive layer arranged in an electrical component.

At least the lateral faces of the longitudinal side of the contact layer may be completely or partially covered with the adhesive layer. If, in particular, the contact layer comprises separating regions, with which the sub-regions are completely separated from one another, this results in an encapsulation effect at least for the sub-regions not located at the narrow sides of a longitudinally extending contact layer. The sub-regions may thus be completely surrounded with the adhesive and, for example, a substrate therebeneath and electrical contacting or a bonding layer therebeneath.

The adhesive arranged between the contact layers of the two components or the adhesive layer may however also be arranged such that the lateral side faces of the contact layer are not covered with the adhesive at the edge of the contact region and only the major face of the contact layer facing the adhesive layer and the patterning present therein are covered with adhesive. If one of the two components comprises a contact layer without patterning, this means that then only the major surface of the contact layer facing the adhesive layer is covered with the adhesive. The method for connecting the two components is then performed such that no adhesive escapes from the glue line and thus the lateral faces cannot be wetted.

An anisotropically conductive adhesive may be used as an adhesive. The adhesive may be vertically conductive relative to the mutually facing surfaces of the contact layer after bonding of the two components. Horizontally, the adhesive layer generally does not exhibit any electrical conductivity. Au anisotropically conductive adhesive (anisotropic conductive file, ACF) is thus distinguished in that it is not equally electrically conductive in all directions, in particular it is electrically conductive in just one direction. The anisotropically conductive adhesive may in particular be arranged between the first and second contact layer such that corresponding sub-regions arranged over one another, for example, of the respective contact layers or indeed only the sub-regions of a patterned contact layer and the corresponding unpatterned contact layer are connected electrically conductively, while adjacently arranged sub-regions are not connected together electrically conductively. To this end, the electrically anisotropically conductive adhesive may comprise an electrically conductive filler material. In particular, the particles of the electrically conductive filler material may be arranged and configured such that electrically conductive paths are not formed in all directions, and in particular only in one preferred direction in the adhesive, preferably in the vertical direction relative to the main planes of the contact layers. The size and density of the filler material, i.e. of the electrically conductive particles, may in this case, for example, be conformed to the spacing of the corresponding first and second contact layers and/or the minimum width of the separating regions.

An electrically anisotropically conductive adhesive may thus allow a extensive and in particular unpatterned adhesive bond between the first and second substrates or the first and second contact layers such that the second component is attached durably and in a mechanically stable manner to the optoelectronic component. If at least one of the contact layers comprises sub-regions separated completely from one another, encapsulation of the sub-regions may also be achieved with the electrically conductive adhesive, as stated above in general terms. The absence of or only slight electrical conductivity in the horizontal direction also stops penetration of undesired substances which are More readily able to penetrate into the adhesive joint as a result of horizontal conductivity. In particular, penetration of ionic species such as, for example, protons or other corrosive ions is prevented or at least reduced.

The anisotropically conductive adhesive or the conductive adhesive in general may additionally contain a material which binds or blocks undesired substances such as corrosive species or water (i.e. a getter material). In this way, encapsulation, for example, of sub-regions of the contact layer may proceed even better. Preferably, the getter material is selected such that formation of vertical electrical conductivity between the contact layers is not impaired. For example, the particle size of the particles of the getter material is selected to be distinctly smaller than that of the filler material in the adhesive, i.e. the particle size or the electrically conductive particles. In the case of anisotropically conductive adhesives, the particle size should additionally also be distinctly smaller than the thickness of the adhesive layer in the regions in which there is an electrically conductive connection after connection of the components.

The electrically conductive adhesive on the one hand and the material of the bonding layer or of the substrate may be selected such that the electrically conductive adhesive adheres better to the bonding layer or the substrate than to the contact layer. This is relevant in particular when separated sub-regions of the contact layer(s) are present. For example, the adhesive layer may be epoxide- or acrylic-based and the bonding layer may be formed of a transparent conductive oxide or the substrate may be firmed of a polymer or glass. If a metal layer is present as the contact layer, in all the stated cases better adhesion of the electrically conductive adhesive layer to the substrate or to the bonding layer is ensured than to the contact layer comprising metal. It may thus be possible additionally to improve adhesion of the second component to the optoelectronic component and to reduce or prevent the penetration of undesired, delamination-promoting substances (such as water or corrosive substances) which stem from the application of mechanical stress to the optoelectronic device or result from forces which promote relative motion of the second component relative to the optoelectronic component.

The optoelectronic device comprises a first electrode which is of extensive configuration. The first electrode should be understood to be the electrode, connected directly (i.e. not indirectly via the functional layers of the active region) with the first contact layer.

"Extensive" means in particular that the electrode is not a pixel electrode and therefore is not configured such that, by interaction with a second, in particular strip-form electrode, only a sub-region of the active layer is controlled (namely by interaction in each case of just one sub-region of the two electrodes arranged in the active region). Instead, extensive means that the entire active region of a radiation-emitting device is switched by the first electrode and that in this regard the necessary overlap of the two electrodes is maximum. It is however also possible for an extensive electrode to be present in a segmented area light source, i.e. in an area light source which, to keep problems to a minimum in the event of failure of a region and in the event of the occurrence of black spots, is subdivided into a plurality of segments. "Extensive" may in particular mean that the active region of the component, the segment of an area light source or the first electrode in the region of the active region has a surface area greater than or equal to a few square millimeters, preferably greater than or equal to one square centimeter and particularly preferably greater than or equal to one square centimeter.

The separating regions of the optoelectronic device take the form of linear channels and have a width of 0.1 to 0.5 mm, in particular 0.2 to 0.3 mm. If the fact is taken into account that the particle size of the conductive particles in the conductive adhesive, in particular anisotropically conductive adhesive, amounts to just a few micrometers, it follows that such a width of the separation regions does not allow or allows only to a reduced extent the formation of electrically conductive connections between the sub-regions of the contact layer. In addition, the regions are wide enough that sufficient adhesion to the substrate or the bonding layer is possible to increase mechanical stability and in addition also to allow adequate encapsulation of a sub-region of the contact layer.

Often the optoelectronic device is configured such that (in the longitudinal direction) a separating region is arranged for instance every 10 to 25% of the total length of the contact layer. In the case of smaller devices in which the longitudinal extent of the contact region may be, for example, 0.5 to 1 cm long, the number of separating regions may also be smaller, for example, 2. In the case of larger devices, for example, contact layers with a longitudinal extent of 10 cm, the number of separation regions may even exceed ten. Often the distance between two separation regions will therefore amount to around 1 cm (thus, for example, 0.5 to 1.5 cm). As a rule, this distance will amount to at least 1 mm. In the case of smaller distances, it is otherwise possible, especially when an anisotropically conductive adhesive is used, for the small extent of the sub-regions to lead to poor or reduced conductivity in the vertical direction.

Sub-regions of different sizes may be present in the contact layer. The contact layer then comprises at least one central region and at least one peripheral region, wherein the longitudinal extent of the peripheral region is smaller than that of the central region (a central region in this case has more than one adjacent sub-region, in particular it has two adjacent sub-regions, while a peripheral area as a rule only has one adjacent sub-region). Often at least two peripheral regions are present at the two ends of the contact layer (relative to the longitudinal extent). There is often also more than one central region, in particular in the case of devices with a longitudinal extent of the contact layer of ≥1 cm. As stated above, this also correlates with the distance conventionally provided between two separating regions.

The peripheral regions may (in particular in contact layers with a longitudinal extent of 1 to 10 cm) assume a width of 2 to 10%, often 5% of the total longitudinal length (these figures relating to just one of the two peripheral regions where there are two peripheral regions). Naturally, where the peripheral regions have very small longitudinal dimensions, the width will tend to be more in the range of 10% and where the contact layer has very large longitudinal dimensions of, for example, 10 cm will tend to be more in the range of 2%. Still greater dimensions may in individual cases also lead to widths of the peripheral region being selected which result from multiplication of the above-stated percentages and the longitudinal dimensions stated by way of example.

The peripheral regions may additionally serve to contact electrically the contact layer from the lateral narrow sides. However, they exhibit a width which does not affect or only slightly affect the properties of the device with regard to delamination. Since the majority of the central regions or the one central region may be completely encapsulated by the adhesive layer, penetration of undesired substances into the central region may be prevented such that ageing resistance is not significantly modified thereby. At the same time, however, the peripheral regions are also of such a width that electrical conductivity is provided in the vertical direction and thus additional activation by additional electrical contacts is ensured at the lateral narrow sides.

Both the first substrate and the second substrate may be made from a rigid material or alternatively from a flexible or pliable material. In this case, either just the first or just the second substrate may consist of the rigid material, and the respective other substrate from the flexible material. However, both substrates may also be made from a rigid material or both substrates may be made from a flexible material.

The rigid material may, for example, be glass or also plastics, for instance an epoxy resin board. A flexible substrate may, for example, comprise a thermoplastic polymer, but also a thin layer of a thermoset. In addition, both the substrate of rigid material and the flexible substrate may comprise a laminate or a layer sequence consisting of a plurality of layers.

The active region of the optoelectronic component may be configured such that it emits electromagnetic radiation when in operation. The electromagnetic radiation may exhibit at least part of an ultraviolet to infrared wavelength range.

The optoelectronic component may be suitable for converting electromagnetic radiation into an electrical current or an electrical voltage. In particular, the active region may also be selected to result in an organic optoelectronic component, the active region then comprising at least one layer of an organic material. In particular this layer of organic material may be selected such that it is suitable for emitting electromagnetic radiation when in operation or is suitable for converting electromagnetic radiation into electrical current or an electrical voltage.

The optoelectronic component of the optoelectronic device is an organic optoelectronic component. In particular, the optoelectronic component may take the form of an organic light-emitting diode (OLED). The OLED may, for example, comprise in the active region a first electrode arranged on the substrate. A functional region with one or more functional layers of organic materials may be arranged over the first electrode. The functional layers may, for example, take the form of electron transport layers, electroluminescent layers and/or hole transport layers. Blocking layers for holes or electrons may also be present. A second electrode may be applied over the functional layers. In the functional layers, electromagnetic radiation of a single wavelength or a range of wavelengths may be generated by electron and hole injection and recombination. In this case, an observer may perceive a monochrome, polychrome and/or mixed-color light appearance, for example, a white light appearance.

Our method of producing an optoelectronic device may comprise in particular the steps:

A) providing an optoelectronic component with an active region and at least one first contact layer arranged on a first substrate in a first contact region, the first contact layer being connected electrically conductively with the active region;

B) providing a second substrate with at least one second contact layer arranged in a second contact region;

D) applying an electrically conductive adhesive in the first contact region and/or in the second contact region;

E) arranging the second substrate over the first substrate such that the first contact layer is connected electrically conductively with the second contact layer via the electrically conductive adhesive.

The first contact layer and/or the second contact layer are applied in a step C1) in patterned manner before being provided or are patterned in a step C2) subsequent to step A) and/or step B).

In step A) an optoelectronic component with an active region may be provided which comprises one or more features of the above-stated examples. At the same time or as an alternative, the second substrate, prodded in step B), may also be selected such that it comprises one or more features of the above-stated examples.

Patterning may proceed according to step C2) by etching the contact layer. In this way, patterning may be performed particularly easily since the etchant may, for example, be selected such that it etches the contact layer but not the underlying substrate or the underlying bonding layer. For example, a metal contact layer may be etched using an acid which does not attack an underlying layer of a transparent conductive oxide. Etching may here proceed, for example, using masks and also using a combination of two etching steps in which the first is performed anisotropically and the second isotropically such that undercuts are produced as patterning features. Such undercuts may then additionally lead to a material bond between the adhesive layer and the bonding layer or the interlocking connection upstream of the substrate between contact layer and adhesive layer. Patterning may, however, also be introduced, for example, by applying contact layers of metal using photolithographic methods or using masks or self-organising monolayers.

Further advantages and developments are revealed by the following examples described below in conjunction with the Figures.

In the examples and figures, identical or identically acting constituents may in each ease be provided with the same reference numerals. The elements illustrated and their size ratios to one another should not in principle be regarded as being to scale, but rather individual elements such as, for example, layers, components, structural elements and regions, may have been made exaggeratedly thick or large to illustrate them better and/or to make them easier to understand.

FIG. 1 shows an example of an optoelectronic device. In this case, the optoelectronic device comprises an optoelectronic component 1 with a first substrate 10, which may for example be made of glass. An active region 11 suitable for emitting electromagnetic radiation is arranged on the substrate. The optoelectronic component 1 takes the form of an OLED. In the active region, a first electrode 12, organic, functional layers 13 and a second electrode 14 are applied to the substrate. The first electrode 12 may then in particular be the anode. The second electrode 14 is then the cathode. It is however also possible for the first electrode to be the cathode. Furthermore, the active region comprises an encapsulation 15 suitable for protecting the electrodes 12, 14 and the functional layers 13 from harmful external effects such as for instance moisture or oxygen.

The functional layers 13 may comprise organic polymers, organic oligomers, organic, small, non-polymeric molecules ("small molecules") or combinations thereof. The emitter layer may contain fluorescent and/or phosphorescent emitters, for example, based on "small molecules". Suitable materials and arrangements and patterning of the materials for functional layers are known and are not therefore explained further.

The second electrode 14 may take the form of a cathode and thus serve as an electron-inducing material. Aluminum, barium, indium, silver, gold, magnesium, calcium or lithium may inter alia in particular prove to be advantageous cathode materials. If a top emitter or a top/bottom emitter is present, the second electrode may also be transparent and, for example, consist of or comprise a transparent conductive oxide.

Encapsulation 15 of the active region 11 serves to protect the electrodes 12, 14 and the functional layers 13 from moisture and oxidising substances such as for instance oxygen. The encapsulation 15 may in this case be of single- or multilayer construction and comprise, for example, planarization layers, barrier layers, water- and/or oxygen-absorbing layers.

In the example shown, the optoelectronic component 1 in particular takes the form of a bottom emitter. This means that the electromagnetic radiation generated in the active region 11 is emitted through the first substrate 10. To achieve an increase in contrast and to prevent the reflection of light which may impinge from outside on the active region 11 and in particular on the electrodes 12, 14, a circular polariser 16 is arranged on the opposite side of the substrate 10 from the active region. Alternatively, however, the OLED may also take the form of a top emitter, i.e. the generated electromagnetic radiation is emitted through the encapsulation 15. Finally, the device may also be a top/bottom emitter, the emitted radiation being emitted both through the first substrate 10 and through the encapsulation 15.

The example of the optoelectronic component 1 in FIG. 1 is shown purely by way of example and may be modified or expanded in accordance with examples used with OLEDs.

The first electrode 12 is bonded electrically conductively with the bonding layer 18. Both layers are applied to the first substrate 10. A contact layer 19 of metal, in particular of copper, is arranged on the bonding layer 18. The patterning of the contact layer 19 is not shown here since the figure shows a section through the optoelectronic device at right angles to the longitudinal side of the contact layer. The bonding layer 18 may be made of ITO as may the first electrode 12. The first electrode 12 this merges into the bonding layer 18 present in the contact region 17. Alternatively, however, it is also possible for the first electrode 12 to merge into the contact layer 19 without a bonding layer 18 being present. In this case, the first electrode 12 and the contact layer 19 may also be made of different materials.

The optoelectronic device further comprises a second component 2 with a second substrate 20, for example, of glass. An electrical component 21 may be arranged on the substrate, which component is suitable for controlling the active region 11 of the optoelectronic component 1. The electrical component 21 may also be part of an electronic circuit suitable for controlling the optoelectronic component 1. In particular, the electrical component 21 may, for example, be an integrated circuit (IC) or an active or passive electronic component or an active or passive electronic element for electrical circuits. Furthermore, a plurality of such electrical components 21 may also be arranged on the second substrate 20. As an alternative or in addition to the electrical component 21, a further optoelectronic component may also be arranged on the substrate 20. Such an optoelectronic component on the second substrate 20 may in particular also comprise features like the optoelectronic component 1. In this way, it is then, for example, possible to connect an optoelectronic component 1 with a first substrate 10 and a second component 2 with an optoelectronic component 21 electrically conductively together and to interconnect the optoelectronic components 2, 21 electrically.

The electrical component 21 is moreover connected to a two-layer supply line which, like the optoelectronic component 1, comprises a second contact layer 29 and a second bonding layer 28. As already stated for the optoelectronic component 1, the bonding layer 28 is not in this case absolutely necessary. The electrical component 21 may, for example, be connected electrically conductively with the layers 28, 29 by adhesive or soldered joints.

The second substrate 20 of the second component 2 is arranged relative to the first substrate 10 of the optoelectronic component 1 such that the mutually facing surfaces of the substrates overlap in the contact region 17. In particular, the mutually facing surfaces are arranged parallel to one another in the example shown. An adhesive layer 3 consisting of an electrically isotropic conductive adhesive is arranged between the contact layers 19, 29. The adhesive here completely envelops the first contact layer 18, i.e. it also covers the lateral sides. As an alternative to the example shown, the adhesive layer 3 may also run as far as the encapsulation 15 of the optoelectronic component 1 such that, for example, a bonding layer 18 may be omitted, but the contact layer 19 may nonetheless be encapsulated. It goes without saying that the adhesive layer 3 may run as far as the encapsulation 15 even when a first bonding layer 18 is present. The electrically anisotropic conductive adhesive is particularly suitable for conducting current vertically between the contact layers 19, 29, i.e. current is conducted in the plane of the paper. The adhesive layer 3 may have a thickness of 10 μm, for example. It may, for example, be based on an epoxy or acrylic resin and comprise as conductive particles two-layer particles with a polymer core and a metal shell, for example, of nickel.

The optoelectronic component 1 and the second component 2 may be arranged at a distance 4 from one another. This distance may in particular be ≥0.1 mm. Through the provision of such a distance, first and second substrates may, for example, also be used which exhibit different coefficients of thermal expansion such that in the event of temperature changes strains and forces, for example, of the second substrate 20 and the encapsulation 15 relative to one another may, for example, be avoided. In addition, such a distance may also be advantageous in terms of manufacturing and assembly tolerances. Furthermore, a distance 4 of less than 1 mm may be advantageous for a compact and space-saving construction of the optoelectronic device.

Both the first substrate 10 and the second substrate 20 or even both substrates 10, 20 may be made of glass. Alternatively, one of the two substrates 10, 20 or both substrates 10, 20 may comprise quartz, plastics films, metal, metal foils, silicon waters or any desired other substrate material.

FIGS. 2A to 2H show a method of producing the optoelectronic device. The figures show how the optoelectronic component 1 is produced.

Figure 2A:
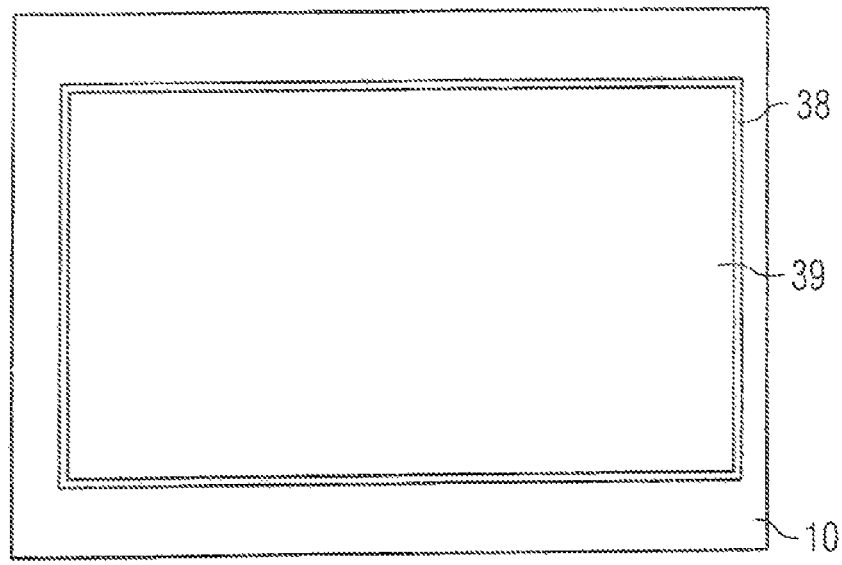
FIGS. 2A to 2H are schematic representations of a method for producing an optoelectronic device shown in plan view.

FIG. 2A first shows the first substrate 10 provided. A first electrically conductive layer 38 is arranged directly on the first substrate 10, the bonding layer 18 and the first electrode 12 subsequently being formed from the first layer. A second electrically conductive layer 39 (which is as a rule arranged substantially congruently with the first conductive layer 38 on the substrate 10) is arranged directly on the first conductive layer 38, the contact layer subsequently being formed therefrom.

Figure 2B:
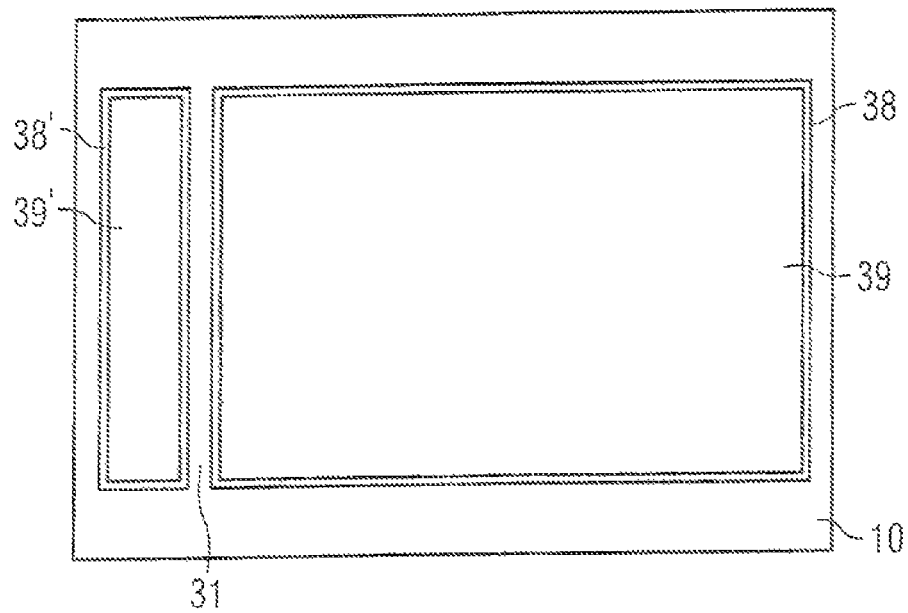

FIG. 2B shows that in the electrically conductive layers 38, 39 an exposed region 31 is produced, for example, by laser ablation, resulting in two separate first conductive layers 38, 38' and second conductive layers 39, 39', which subsequently serve in contacting of the first electrode 12 and the second electrode 14.

Figure 2C:
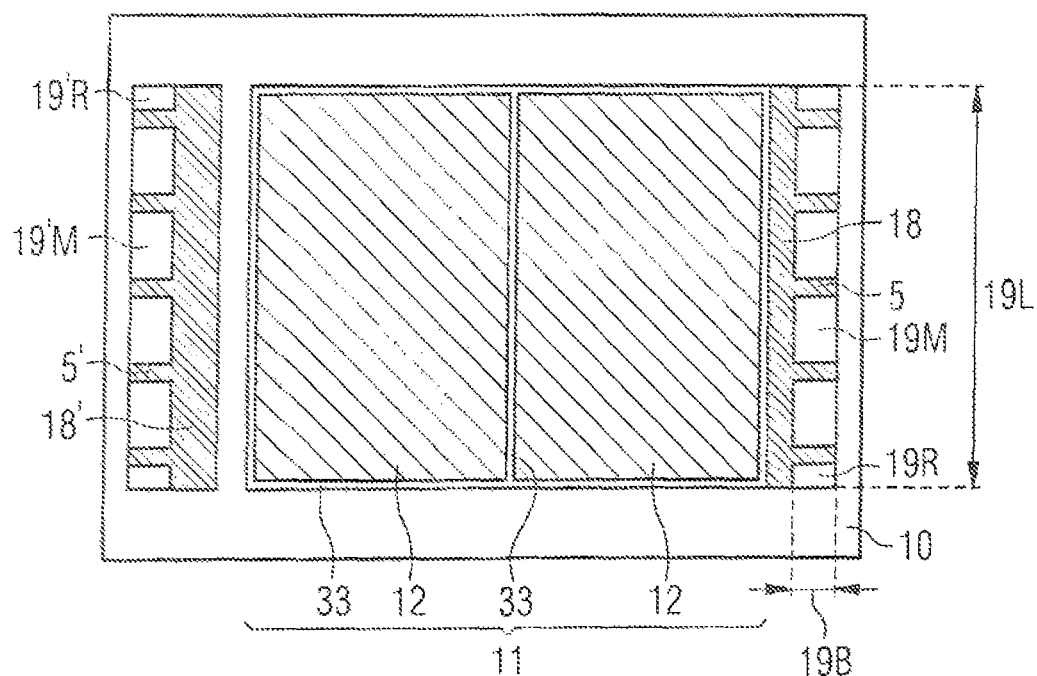

FIG. 2C shows how the contact layer 19 was produced from the second electrically conductive layer 39. The contact layer 19 in this case exhibits a longitudinal extent 19L and a width 19B. The region spanned by the width 19B of the contact layer and the longitudinal length 19L of the contact layer corresponds substantially to the contact region 17. The contact layer 19 is formed by a plurality of sub-regions 19R, 19M, four central regions 19M being present and a peripheral region 19R at each end in the longitudinal direction. The sub-regions 19R, 19M are separated from one another by separating regions 5. In the separating regions 5, the underlying bonding layer 18 is visible which also extends further towards the first electrode 12.

The contact layer with central regions 19'M and peripheral regions 19'R and separating regions 5' arranged therebetween may accordingly be formed in the region intended for the second electrode 14. Here, too, the underlying bonding layer 18' is visible in the separating regions 5'.

Patterning of the contact layer 19 may proceed, for example, in that the second electrically conductive layer 39 is covered selectively with a protective material and then the second electrically conductive layer 39 is etched, wherein the regions of the second electrically conductive layer 39 covered by the protective material are retained. The first electrically conductive layer is substantially unmodified by this method step. The second electrically conductive layer 39 or the contact layer 19 may be formed for instance of metal and the bonding layer 18 and the first electrode 12 of a transparent electrically conductive oxide. Patterning by the protective material may accordingly be performed using an etching bath, for example. The protective layer present on the remaining central regions 19M and peripheral regions 19R of the contact layer 19 may subsequently be removed, for example, by a solvent. Advantageously, conductor tracks 33 may additionally also be provided in the active region 11 of the optoelectronic component using this method. As with the sub-regions of the contact layer 19, this ma also be performed by arranging a protective layer which is subsequently removed. Such conductor tracks 33 may be used to make the luminance of area light sources more uniform as a result of the more uniform current distribution.

Figure 2D:
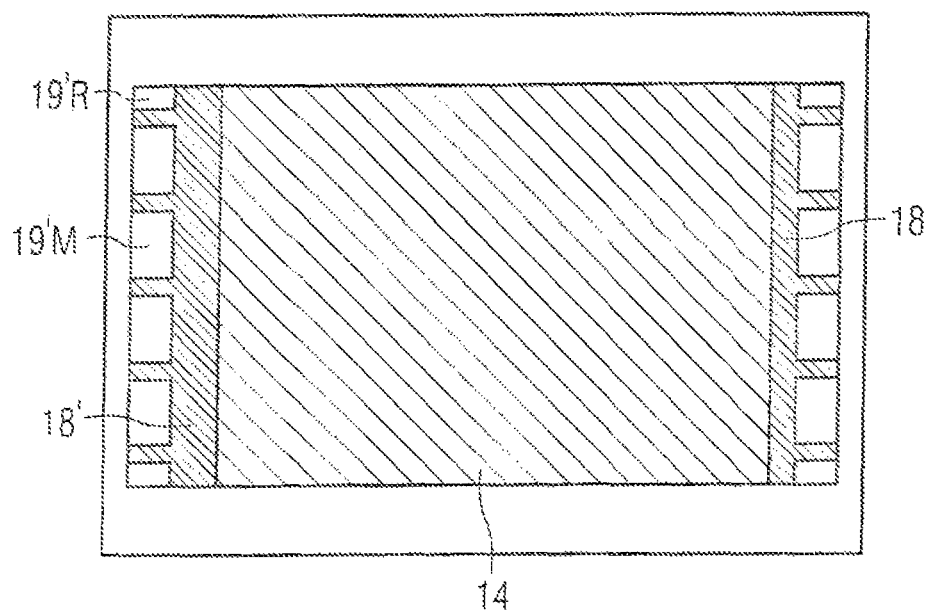

FIG. 2D shows the situation after application of the second electrode 14. One or more functional layers 13 were previously applied to the first electrode 12. These are not shown for the sake of clarity. The second electrode 14 here contacts the bonding layer 18'. For clarity's sake, the insulating material arranged in the previously exposed region 31 and the precise configuration of the second electrode 14, in particular with regard to the differences in height in the transition to the bonding layer 18', and the precise configuration in the bonding layer 18 were not shown.

Figure 2E:
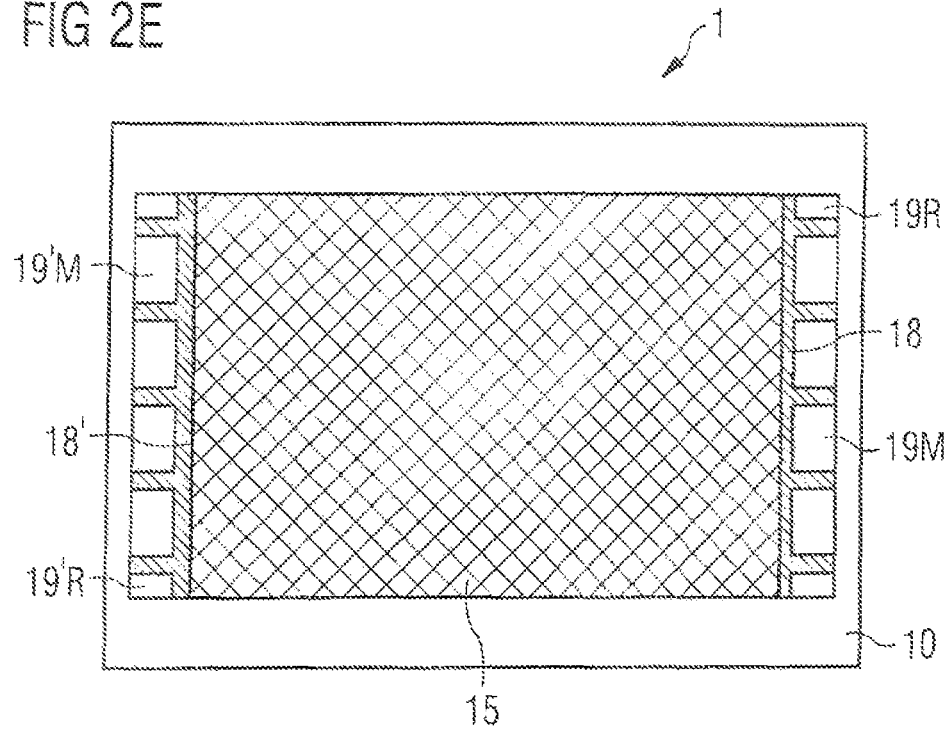

FIG. 2E shows the situation after the application of encapsulation 15 over the active region 11.

Figure 2F:
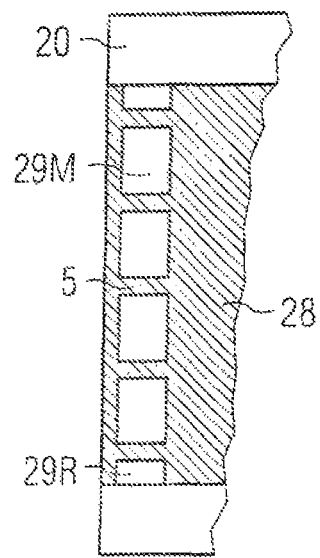
Figure 2G:
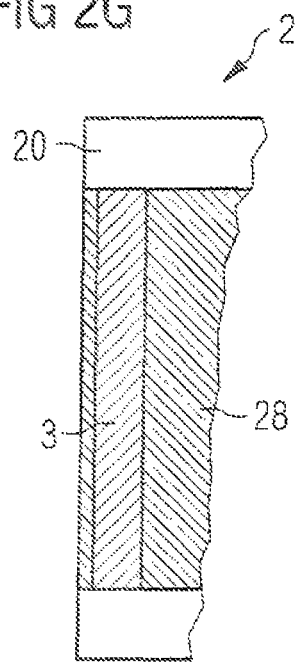

FIGS. 2F and 2G show a portion of a second component 2, which is configured for contacting with the optoelectronic component 1. The substrate 20 of this second component 2 may in particular be a "flexible substrate," a flexible substrate being understood to mean in particular a plastics substrate, for example, a substrate comprising a plurality of polymer layers, for instance a substrate based on polyimide films.

FIG. 2F shows the second contact layers 29 produced as explained in relation to FIG. 2C, with peripheral regions 29R and central regions 29M. Under them and in the separating regions 5 between the sub-regions of the second contact layer 29, the second bonding layer 28 arranged in the second substrate 20 is apparent. FIG. 2G shows that an adhesive layer 3 of an anisotropically electrically conductive adhesive is arranged for contacting the second component 2 with the optoelectronic component 1. The adhesive layer 3 covers the contact layer 29 completely such that the separating regions 5 and the central regions 29M are also covered completely by the adhesive layer 3 at the lateral side faces formed by the separation regions 5.

Figure 2H:
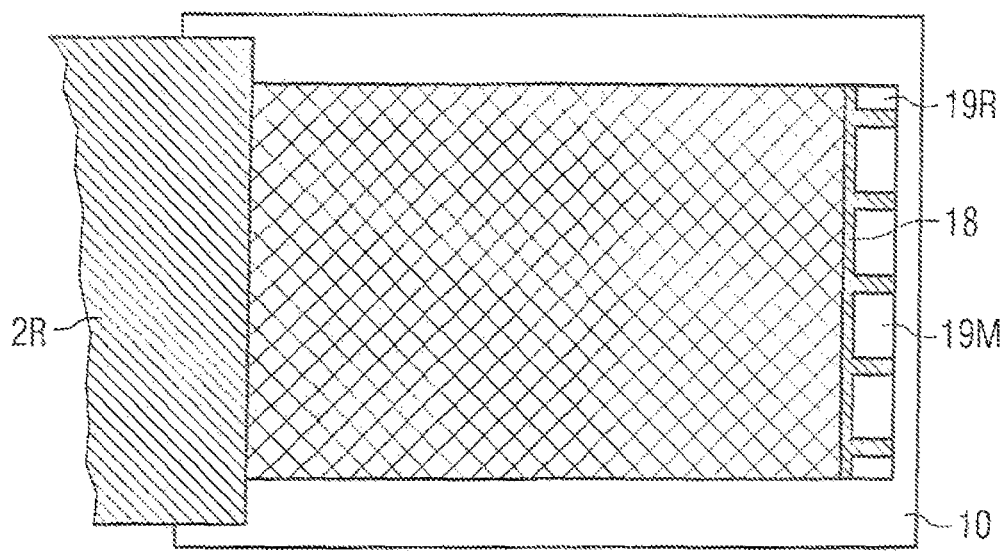

FIG. 2H finally shows the back 2R of the second component 2, which has been arranged on the optoelectronic component 1. Here, too, just one sub-region of the second component 2 is shown.

In the examples according to FIGS. 2A to 2H, both the first contact layer 19 and the second contact layer 29 have been patterned. In addition, patterning proceeds such that the separating regions 5 of the first contact layer 19 and the second contact layer 29 are arranged directly one above the other. This is not absolutely essential, but may be performed in this manner for reasons of process economy. Arrangements are thus possible, for example, in which just the contact layer 29 of the second component is patterned, in particular if patterning of the contact layer 19 is not readily possible during the process of producing the optoelectronic component 1 because of other process steps being performed. In addition, the adhesive layer 3 may completely cover not just the side faces of the central regions 29M of the second component 2, but also those of the optoelectronic component 1, for example, if unlike in FIG. 2E, the outer edges of the bonding layer 18, 18' and the sub-regions of the contact layer 19, 19' are not positioned over one another.

FIG. 2H additionally shows the situation in which first just contacting of the second electrode 14 by a second component 2 was carried out. Likewise, contacting the first electrode 12 may also proceed via the sub-regions 19R, 19M of the contact layer 19 and the bonding layer 18.

Something which is not shown is that, according to one example, curing of the adhesive layer 3 may be necessary. For example, the anisotropically conductive adhesive CP5720GT made by Sony Chemicals may be used. The two components 1, 2 may be bonded together using a pre-bonding step at a temperature of 70 to 100° C. and a pressure of 0.5 to 1.5 MPa for a few seconds and a main bonding step at a temperature of 170 to 200° C. and a pressure of 3 to 5 MPa for 10 seconds. Suitable electrically anisotropically conductive adhesive are, as already explained, epoxy adhesives or acrylic adhesives which contain electrically conductive particles in the micrometer range, wherein the particles may, for example, have two layers with a polymer core. In general, conventional processing temperatures are 130 to 220° C. at 1 to 5 MPa for a period of 5 to 15 seconds. As explained, this method may also be carried out in two stages. In this case, this method may, for example, be used to produce an adhesive layer 3 of approx. 10 µm. Due to the thickness of the contact layers 19, 29 of 5 to 10 µm formed, for example, from copper, the result (if just one of the contact layers is patterned) is a double thickness adhesive layer in the region of the separating regions 5 which leads to substantially no electrical conductivity being present in the vertical direction in the region of the separating regions 5. All the process parameters apply both for chip-on-glass (COG), flex-on-glass (FOG), flex-on-board (FOB), flex-on-flex (FOF), chip-on-flex (COF), chip-on-board (COB) and similar applications.

The improvement in the properties of the resultant device may be determined by a peel test. To measure peel strength, a device with a contact layer of copper and a bonding layer of ITO was selected, in which are present three central regions with a width of 0.5 mm, three peripheral regions with a width of 0.1 mm and four separating regions with a width of 0.25 mm.

A tensile force is applied to a 1 cm wide piece of an at least partially flexible second component 2 in the vertical direction relative to the adhesive surface. The peel tests show that even if just one of the contact layers 19, 29 is patterned with separating regions, peel strength is increased by 50% relative to an unpatterned contact layer. If both contact layers are patterned, peel strength may be increased by a further 50%. The higher peel strength also improves ageing resistance which, as explained above, may be additionally improved by encapsulating at least the central regions 19M, 29M of the contact layers 19, 29.

The description made with reference to examples does not restrict this disclosure to those examples. Rather, our devices and methods encompass any novel feature and combination of features, including in particular any combination of features in the appended claims, even if the feature or combination is not itself explicitly indicated in the claims or examples.

The invention claimed is:

1. An optoelectronic device comprising:
   an optoelectronic component with a first substrate on which are arranged an active region and a first contact region;
   at least one first contact layer arranged in the first contact region; and
   a second component with a second substrate on which is arranged at least one second contact layer arranged in a second contact region,
   wherein
   the first contact layer connects electrically conductively with the active region,
   the first contact layer and the second contact layer are bonded together electrically conductively via an adhesive layer comprising an electrically conductive adhesive, and
   the first contact layer and/or the second contact layer are at least partly patterned, and
   the first contact layer and/or the second contact layer comprises sub-regions, separated from one another at least in part by separating regions filled with the electrically conductive adhesive.

2. The optoelectronic device according to claim 1, further comprising a bonding layer between the first contact layer and the first substrate and/or the second contact layer and the second substrate.

3. The optoelectronic device according to claim 2, wherein the electrically conductive adhesive and the material of the bonding layer or of the substrate is selected such that the electrically conductive adhesive adheres better to the bonding layer or the substrate than to the first contact layer.

4. The optoelectronic device according to claim 1, wherein the first contact layer and/or the second contact layer comprises a metal.

5. The optoelectronic device according to claim 1, wherein the electrically conductive adhesive is an anisotropically conductive adhesive.

6. The optoelectronic device according to claim 5, wherein the device is configured such that the anisotropically conductive adhesive provides substantially only an electrical conductivity which extends substantially vertically relative to the mutually facing surfaces of the first contact layer and the second contact layer.

7. The optoelectronic device according to claim 1, wherein at least one of the sub-regions of the first contact layer and/or the second contact layer is covered with the adhesive layer over at least part of the lateral faces.

8. The optoelectronic device according to claim 1, further comprising a first electrode.

9. The optoelectronic device according to claim 1, wherein width of the separating regions is 0.1 to 0.5 mm.

10. The optoelectronic device according to claim 1, wherein the sub-regions comprise at least one central region and at least one peripheral region, and a longitudinal extent of the peripheral region is smaller than that of the central region.

11. The optoelectronic device according to claim 1, wherein at least two separating regions are present.

12. The optoelectronic device according claim 1, wherein the optoelectronic component is an organic optoelectronic component.

13. A method of producing an optoelectronic device comprising:
   A) providing an optoelectronic component with an active region and at least one first contact layer arranged on a first substrate in a first contact region, the first contact layer being connected electrically conductively with the active region;
   B) providing a second component with a second substrate with at least one second contact layer arranged in a second contact region;
   D) applying an electrically conductive adhesive in the first contact region and/or in the second contact region; and
   E) arranging the second substrate over the first substrate such that the first contact layer connects electrically conductively with the second contact layer via the electrically conductive adhesive;
   wherein the first contact layer and/or the second contact layer are here applied in a step C1) in patterned manner before being provided or are patterned in a step C2) subsequent to step A) and/or step B) and wherein the first contact layer and/or the second contact layer comprises sub-regions, separated from one another at least in part by separating regions filled with the electrically conductive e adhesive.

14. The method according to claim 13, wherein the first contact layer and/or the second contact layer are patterned in step C2) by etching.

15. An optoelectronic device comprising:
   an optoelectronic component with a first substrate on which are arranged an active region and a first contact region,
   at least one first contact layer arranged in the first contact region, a second component with a second substrate on which is arranged at least one second contact layer arranged in a second contact region, wherein 1) the first contact layer connects electrically conductively with the active region,
2) the first contact layer and the second contact layer are bonded together electrically conductively via an adhesive layer comprising an electrically conductive adhesive,
3) the first contact layer and/or the second contact layer are patterned at least in part, and
4) the first contact layer and/or the second contact layer comprises sub-regions separated from one another at least in part by separating regions filled with the electrically conductive adhesive, the sub-regions being connected together electrically conductively.

* * * * *